United States Patent [19]
Chittipeddi et al.

[11] Patent Number: 6,136,620
[45] Date of Patent: Oct. 24, 2000

[54] METHOD OF MANUFACTURE FOR AN INTEGRATED CIRCUIT HAVING A BIST CIRCUIT AND BOND PADS INCORPORATED THEREIN

[75] Inventors: Sailesh Chittipeddi, Allentown, Pa.; William T. Cochran, Clermont, Fla.; Yehuda Smooha, Allentown, Pa.

[73] Assignee: Lucent Technologies Inc., Murray Hill, N.J.

[21] Appl. No.: 09/288,746

[22] Filed: Apr. 8, 1999

Related U.S. Application Data

[60] Division of application No. 09/022,733, Feb. 12, 1998, Pat. No. 5,965,903, and a continuation-in-part of application No. 08/549,990, Oct. 30, 1995, Pat. No. 5,751,065.

[51] Int. Cl.⁷ .......................... H01L 23/48; G01R 31/26
[52] U.S. Cl. .................................................... 438/18
[58] Field of Search ................................ 438/14, 15, 17, 438/18; 257/48

[56] References Cited

U.S. PATENT DOCUMENTS

| | | | |
|---|---|---|---|
| 4,636,832 | 1/1987 | Abe et al. | 357/68 |
| 4,984,061 | 1/1991 | Matsumoto | 357/68 |
| 5,502,337 | 3/1996 | Nozaki | 257/773 |

FOREIGN PATENT DOCUMENTS

| | | | |
|---|---|---|---|
| 0100100 | 7/1983 | Japan | 23/48 |
| 57-79940 | 11/1983 | Japan | 21/60 |
| 04-18777 | 9/1990 | Japan | 23/485 |
| 61-64147 | 2/1996 | Japan | 23/48 |

OTHER PUBLICATIONS

K. Mukai, A. Hiraiwa, S. Muramatsu, I. Yoshida and S. Harada; "A New Integration Technology that Enables Forming Bonding Pads on Active Areas"; IEDM 1981: pp. 62–65.

*Primary Examiner*—Chandra Chaudhari
*Assistant Examiner*—Evan Pert

[57] ABSTRACT

In a method of incorporating BIST (built-in self test) circuitry in an integrated circuit, at least one metal layer is arranged to relieve stress in the substrate under bond pads from wire attachment to these pads. By providing at least one stress relieving metal layer, which can be incorporated into electrical paths of the bond pads and related circuitry, BIST circuitry can be provided, at least partly, in the conventionally non-active semiconductive portion of the substrate under the bond pad. The method allows BIST circuitry to occupy conventionally non-active areas under the bond pads wherein leakage current from stress cracks in dielectric layers under the bond pads can be redirected to a metal layer.

11 Claims, 3 Drawing Sheets

METHOD OF MANUFACTURE FOR AN INTEGRATED CIRCUIT HAVING A BIST CIRCUIT AND BOND PADS INCORPORATED THEREIN

This Application is a Divisional of prior Application Ser. No. 09/022,733, filed on Feb. 12, 1998, now issued as U.S. Pat. No. 5,965,903, to Sailesh Chittipeddi, et al. The above-listed Application is commonly assigned with the present invention and is incorporated herein by reference as if reproduced herein in its entirety under Rule 1.53(b).

This is a continuation-in-part of U.S. Ser. No. 08/549,990, filed on Oct. 30, 1995, entitled "INTEGRATED CIRCUIT WITH ACTIVE DEVICES UNDER BOND PADS", now U.S. Pat. No. 5,751,065.

TECHNICAL FIELD OF THE INVENTION

The present invention is directed, in general, to integrated circuits and, more specifically, to integrated circuits having a built in self test (BIST) circuit and bond pads incorporated therein.

BACKGROUND OF THE INVENTION

The high costs associated with microcircuit manufacture are strong encouragement for determining the acceptability of microdevices at the earliest possible stage of manufacture. Therefore, functional testing at the semiconductor wafer level is preferred over testing at: (a) the microcircuit die (a bare, non-incapulated chip) level, or (b) the finished microdevice level. Conventional chip testing methods to determine the reliability of semiconductor chips have primarily relied upon one of the two industry standard procedures: (a) wafer probing, or (b) statistical sampling. Only the first method, wafer probing, applies at the wafer level; statistical sampling is done at the microcircuit die level of production.

At the wafer level, probing technology is generally accomplished at room temperature by introducing electrical signals to the necessary circuits of individual devices to check for appropriate circuit performance. A semiconductor wafer is approximately eight inches in diameter and may contain an array of from 50 to 5000 microdevices of the same type.

As wafer probing is typically done at room temperature, performance of the microdevice is not evaluated under the thermal load equivalent to full circuit operation in the microdevice's final form. Thermal screening at the wafer level is not technically feasible since a thermal forcing technique is not yet available that can rapidly cycle the relatively large mass of a four or five inch semiconductor wafer. Therefore, chip integrity is still questionable after wafer probing.

Next, the devices are cut from the wafer along a pre-planned grid, called "streets", and separated into individual microcircuit die. Damage incurred during the wafer cutting process is normally evaluated only by visual inspection. The die may be tested at this stage of production to determine the individual reliability of the microchip before incorporation into a larger assembly, sometimes known as a Hybrid Microelectronic Assembly (HMA). However, exhaustive testing of individual die is not economically practical; therefore statistical sampling of the die batch may be employed.

Statistical sampling is the other industry standard microchip testing procedure used to determine electrical function and operating reliability. Using this methodology, one to two percent of the individual die are separated from the wafer, mounted into a custom test fixture, and subjected to dynamic electrical and thermal evaluation. Based upon the compiled test results, predictions are then made concerning the other 98 to 99 percent of chips from that batch. Chips, which were used for testing, are generally not commercially useable after having been mounted in the fixture and tested.

At the next stage of production electrical wires are attached to the bond pads to provide connectivity between the integrated circuits on the die and the final electrical circuit. The attachment of wires to the bond pads traditionally introduces certain stresses into the microcircuit, primarily in the area beneath the bond pads. The die are subsequently encapsulated into their final electrical package, an HMA. At this level, the final product can again be tested for proper functionality; however, the entire cost of production has already been expended and a failure at this level may result in a total waste of the microchip.

Therefore, for the most part, chip reliability is uncertain until the chips are assembled in the final electrical package, and the completed HMA package is subjected to final testing. At this point in the manufacturing process, non-functional HMA packages must undergo labor intensive troubleshooting to determine the cause and extent of failure. In many cases the cost of repairing a faulty HMA package exceeds the cost of producing the entire package.

One method of on-wafer functional testing currently in use is that of built-in test (BIT) or built-in self test (BIST). During these tests, a portion of the semiconductor wafer is designed and manufactured to create the signals that test specific critical modules of the individual devices, when appropriately driven by external test equipment. Unfortunately, however, the BIST circuitry is conventionally placed within the principal area of the microchip. The presence of the BIST circuitry takes away valuable space that could otherwise be used for additional primary circuitry. Therefore, the capability of testing the circuit comes at the high price of sacrificing space within the microchip area, and the useable chip density of the wafer is reduced by the area dedicated to BIST.

Accordingly what is needed in the art is a device and methodology that provides a BIST circuit without reducing the area dedicated to the primary circuitry.

SUMMARY OF THE INVENTION

To address the above-discussed deficiencies of the prior art, the present invention provides, in one embodiment, an integrated circuit having a substrate and active devices formed on the surface of the substrate. Other embodiments of the integrated circuit provide for having at least either three or four metal layers. In a particular embodiment of the present invention, the integrated circuit comprises a bond pad formed over a portion of the active devices. The bond pad has a footprint. As used therein the word footprint means the area covered by the device to which the word refers. The integrated circuit further includes a patterned metal layer having a metal layer footprint that is located between the bond pad and the substrate and a built-in self-test (BIST) circuit that has a BIST footprint, which is located between the substrate and the bond pad. In this particular embodiment, the bond pad footprint overlays at least a portion of the metal layer footprint and the BIST footprint. However, in a more advantageous embodiment, the bond pad footprint overlays a substantial portion of the metal layer footprint and the BIST footprint.

Thus, a broad scope of the present invention provides that a BIST circuit can be positioned at least partially under the bond pad to make more efficient use of the space occupied by an electrical circuit, such as an integrated circuit. This provides distinct advantages over devices of the prior art in that DIST have been positioned in an area between the bond pad and the integrated circuit, which, of course, reduced the amount of space available for the integrated circuit. However, with the present invention, more space is available for the integrated circuit, which is constantly being re-designed to provide more functions for various applications.

In an advantageous embodiment, the patterned metal layer is electrically connected to the bond pad, and in another embodiment, it is electrically connected to at least one device of the active devices.

In another embodiment, the integrated circuit includes a module and the DIST is electrically connected to the module. Of course, it will be readily apparent to those who are skilled in the art that a plurality of such modules may exist within each integrated circuit. In such embodiments, the integrated circuit includes a plurality of the modules located on a plurality of die of a semiconductor wafer and further includes a plurality of DIST circuits wherein each of the plurality of DIST circuits is connected to a different one of the plurality of die.

In yet another embodiment, the integrated circuit further comprises a first dielectric layer separating the patterned metal layer from the bond pad. In such instances, the patterned metal layer is electrically isolated from the active devices by a second dielectric layer. In another aspect of this particular embodiment, the integrated circuit further comprises electrical connections from the bond pad to the active device and from the patterned metal layer to the bond pad or the active devices.

The present invention also provides, in another embodiment, an integrated circuit wherein the patterned metal layer has a spine with a plurality of areas extending from the spine, and in yet another embodiment of the present invention, the patterned metal layer has two electrically connected interdigitated combs.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Contrary to the designs disclosed in conventional devices, one area of the microchip that is suitable for inclusion of BIST technology without a major increase in the size of the chip is the area under the bond pads. The bond pads, which provide the interconnectivity between the integrated circuits on the die and the electrical circuit in which the microchip will be installed, are generally located on the periphery of the integrated circuit. Bond pads are metal areas, exposed at the microchip die level, which are electrically connected to the devices in the integrated circuit via buffers and electrically conducting interconnects. Conventional bonding technology used to attach wires to the bond pads require bond pads which have relatively large dimensions when compared to microdevice dimensions and therefore occupy a significant portion of the chip surface. The area underneath the bond pads therefore occupies a substantial fraction of the entire chip surface.

The electrical connection between the wire and the bond pad requires physical integrity as well as high electrical conductivity. The conventional bonding processes used to form the connection unfortunately lack the necessary physical integrity to adequately protect the dielectric located under the bond pad from potential damage that can occur during the bonding process. If the bond pad rests on a dielectric, experience has shown that the bonding conditions often produce mechanical stresses in the dielectric. These stresses may cause defects which result in leakage currents through the dielectric between the bond pads and the underlying substrate, which is often electrically conducting. As explained below in detail, the present invention provides an integrated circuit with an improved bond pad structure that allows a BIST to be positioned under the bond pad. This configuration substantially reduces the risk of damage to the BIST structure during the bonding process and allows more efficient use of chip area.

Figure 1:
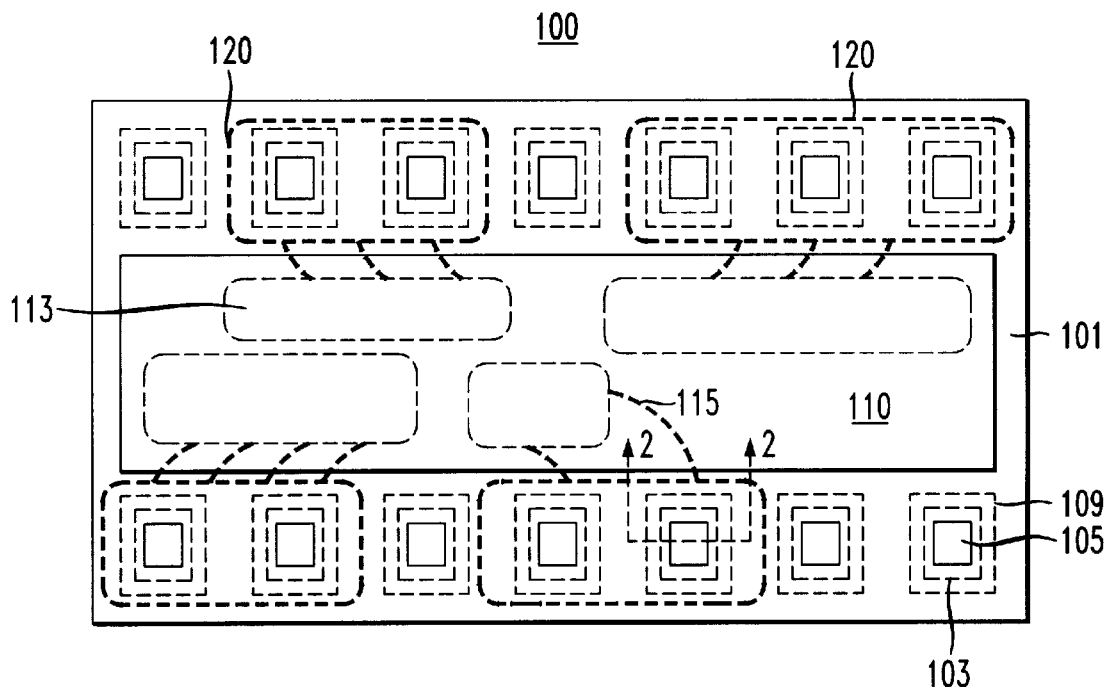
FIG. 1 illustrates a top view of an exemplary integrated circuit constructed according to the principles of the present invention.

Referring initially to FIG. 1, illustrated is a top view of an exemplary integrated circuit constructed according to the principles of the present invention. An integrated circuit chip, generally designated 100, comprises a dielectric layer 101 which overlies the entire chip 100, but has been patterned to expose portions 105 of a plurality of metal bond pads 103. The primary microcircuitry 110 of the integrated circuit is formed in the center of the chip 100. In the illustrated embodiment, the integrated circuit chip 100 further comprises a plurality of BIST devices 120 located underneath and between the bond pads 103.

As one skilled in the art will recognize, combinations of gates, source and drain regions, etc., constitute semiconductor circuits which may be designed to perform a variety of functions. An integrated circuit comprises an assemblage of certain combinations of these semiconductor devices which constitute a plurality of electronic modules. Certain types of these modules are considered critical to the operation of the microdevice. These critical modules therefore are those which would benefit most from BIST technology. The critical modules 113 to be tested by the BIST 120 are formed within the primary microcircuitry 110 of the integrated circuit 100. Individual BIST circuits 120 are electrically connected to the appropriate critical modules 113 on a particular microchip die by circuit traces 115 formed within the chip 100.

One skilled in the art will recognize that circuitry deposited at any layer on the surface of a semiconductor wafer creates a distinct footprint for the given circuitry. Thus, the bond pad 103 and BIST circuitry 120 create a bond pad footprint and BIST footprint, respectively, which will be shown to affect or protect other circuitry of the chip 100. Of course, it will be appreciated by those who are skilled in the art that there may be a plurality of such bond pads and BISTs as shown in FIG. 1.

Figure 2:
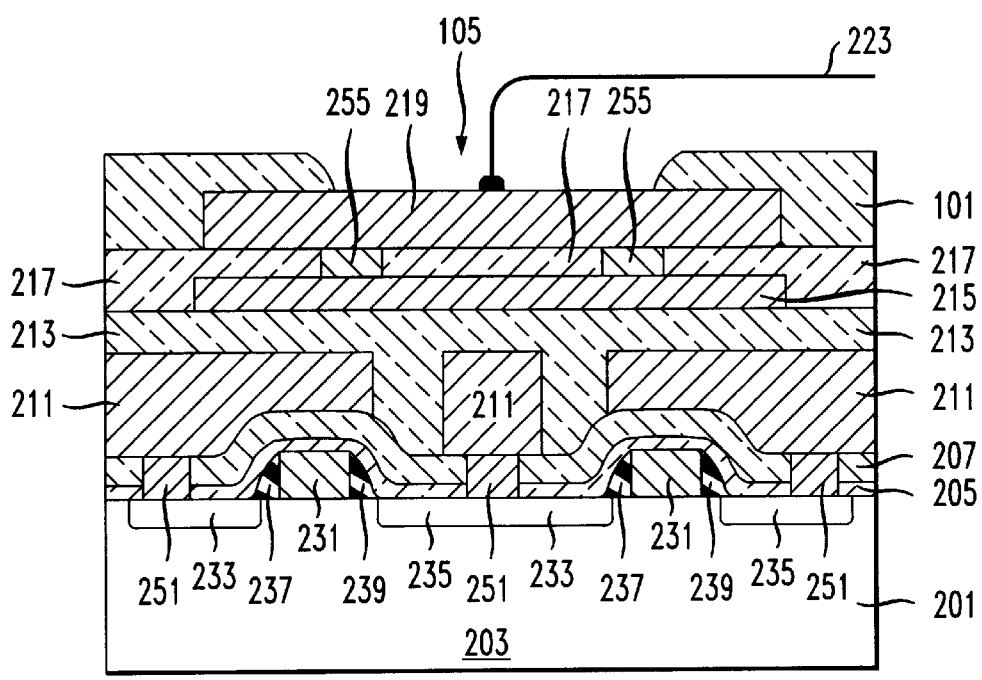
FIG. 2 illustrates a sectional view of a portion of the integrated circuit of FIG. 1 along line 2—2.

Referring now to FIG. 2, illustrated is a sectional view of a portion of the integrated circuit of FIG. 1 along line 2—2. A portion of the periphery of the integrated circuit 100 including the bond pad 103, metal and dielectric layers and active devices under the bond pad 103 is illustrated. Depicted are: a substrate 201, representative active semiconductor devices 203, a first dielectric layer 205, a second dielectric layer 207, a first metal layer 211, a third dielectric layer 213, a second metal layer 215, a fourth dielectric layer 217, a third metal layer 219, and a fifth dielectric layer 101. The accessible portion of the third metal layer 219 constitutes the exposed portion 105 of the bond pad 103 of FIG. 1. Wire 223 has been bonded to the bond pad 103. Dielectric material 217 is formed between metal layers 215 and 219.

For the purposes of further discussion, the BIST circuitry 120 designed to test critical modules 113 within the primary microcircuitry 110 may be symbolized by representative active devices 203, which is referred to as BIST circuitry 203 below. Windows 251 and 255 in dielectric layers 205 and 207 and 217, respectively, provide electrical connections between substrate 201 and metal layer 211, and metal layers 215 and 219, respectively. In the illustrated embodiment, the second metal layer 215 is electrically isolated from the BIST circuitry 203 below by dielectric layer 213. The metal layer 215 nearest the bond pad 103 provides stress relief during the bonding process which prevents dielectric layers 205, 207, and 213 below the bond pad 103 from cracking. If dielectric layer 217 develops defects during bonding, leakage currents do not flow to the substrate 201 or BIST circuitry 203. Instead, the leakage currents flow to metal layer 215. The area underneath the bond pads may thus be used for BIST circuitry without fear of excessive leakage currents through the dielectric layers. With the BIST circuitry located beneath the bond pads, the bond pads may also be spaced more closely together; this allows more bond pads per linear peripheral distance. Further, a more efficient use of silicon is achieved with this physical layout, and therefore a larger yield of die per wafer is realized.

Certain features described generally in the preceding paragraph merit more comment and detail. The BIST circuitry 203 depicted in FIG. 2 is a representative active device, specifically a field effect transistor. The field effect transistor has a gate structure 231, source/drain regions 233 and 235 on opposite sides of gate structure 231, and insulating sidewalls 237 and 239 on opposite sides of the gate structure 231. Gate structure 231 is formed from polysilicon. Insulating portions of the gate structure 231, such as the gate oxide, are well known to those skilled in the art. First and second dielectric layers 205 and 207 are conformal dielectrics such as TEOS and BPTEOS, respectively. Other dielectric layers can also be formed from well known deposited oxides or nitrides. The metal layers may be aluminum. Additives, such as silicon, may be present in minor amounts. As shown, a portion of the integrated circuit, including the BIST circuitry 203, is formed directly under the footprint of the bond pads 103.

The structure depicted will be readily fabricated by those skilled in the art using well known techniques to deposit and pattern the dielectric and metal layers and to form the devices. For example, well known lithographic, ion implantation, etching, etc., processes may be used. Detailed description of suitable processes is therefore not required. The details of an integrated circuit will depend upon the applications desired for the integrated circuit. The integrated circuit will be relatively complex, at least by the standards used at the present time, to warrant the use of multilevel metal interconnects. The packaging connection to the bonding pad is done by any of the conventional and well known techniques presently used.

At least one of the metal layers 211 or 215 is patterned to cover the region 109 underneath the bond pads 103 and covers at least portions of the BIST circuitry 203. In the illustrated embodiment, the second metal layer 215 protects the BIST circuitry 203 during application and bonding of the wire 223. The footprint of the bond pad 103 is substantially aligned with the footprint of the second metal layer 215 as well as with the footprint of the BIST circuitry 203. Metal layer 215 may be patterned so that it is smaller than metal layer 219, yet extending at least to the limits of the exposed portion 105 of the bond pad 103. A window may then extend from the metal layer 219 directly to the active devices 203 below the bond pad 103. The window is filled with metal using well known conventional techniques. This embodiment is desirable because it permits the dielectric layers to be thicker than in the previously described embodiment. Thicker dielectric layers are less likely to crack than are thinner layers.

That the area underneath the bond pads could be used for a BIST location was determined by measuring capacitor leakage through a dielectric layer under various bonding conditions. Although the bonding process stresses the dielectric layer between the two metal layers, we found that in integrated circuits with three or more levels of metal that the second or higher level of metal provided relief from leakage currents in the dielectric.

Variations in the embodiment depicted will be readily thought of by those skilled in the art. Although an embodiment with three metal layers has been described, more metal layers may be present. Additionally, the bond pads need not be on the periphery of the integrated circuit. Furthermore, the bond pads need not be electrically connected to the metal layer immediately underneath.

Figure 3:
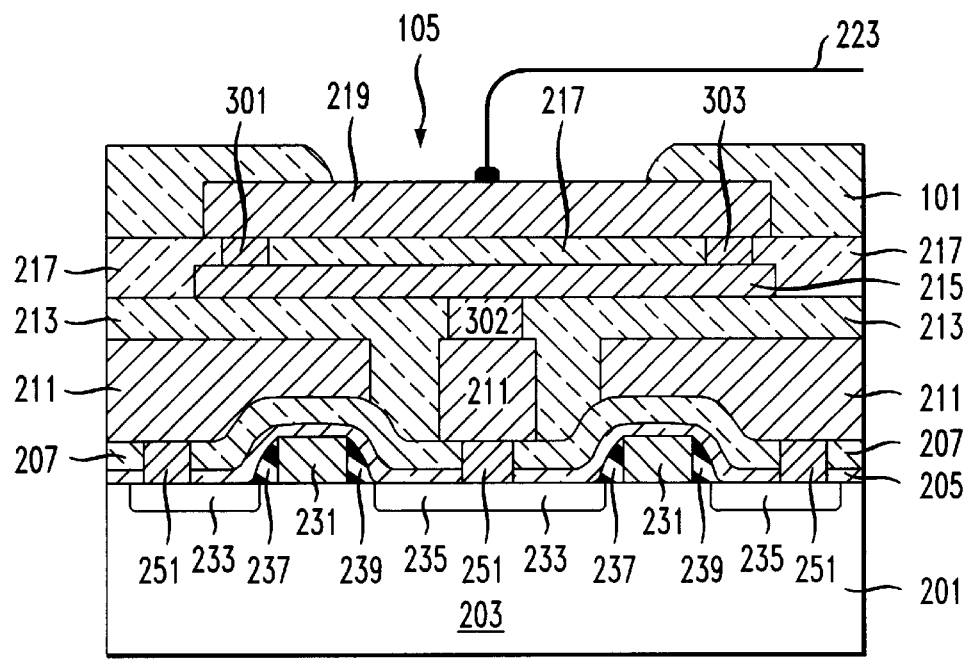
FIG. 3 illustrates a sectional view of an alternative embodiment of the integrated circuit of FIG. 1 along line 2—2.

Referring now to FIG. 3, illustrated is a sectional view of an alternative embodiment of the integrated circuit of FIG. 1 along line 2—2. In the embodiment of FIG. 3, note that windows 301 and 303 are positioned beneath dielectric 101, outside the footprint of the bond pad opening 105. By contrast, in FIG. 2, windows 255 are positioned beneath the footprint of the bond pad opening 105 in dielectric 101. The embodiment of FIG. 3 prevents damage to the windows 301, 303 during probing or wire bonding. The embodiment of FIG. 3 further contains a window 302 which connects metal layer 215 and metal layer 211. Thus electrical connectivity is achieved successively from the wire 223 through bond pad 219; windows 301, 303; second metal layer 215; window 302; first metal layer 211; window 251; and to the BIST circuitry 203 located below. One skilled in the art will recognize that the combination of interconnecting window 302 and placement of windows 301, 303 under dielectric 101 are not directly related, but rather is dependent upon the intended integrated circuitry desired.

Figure 4:
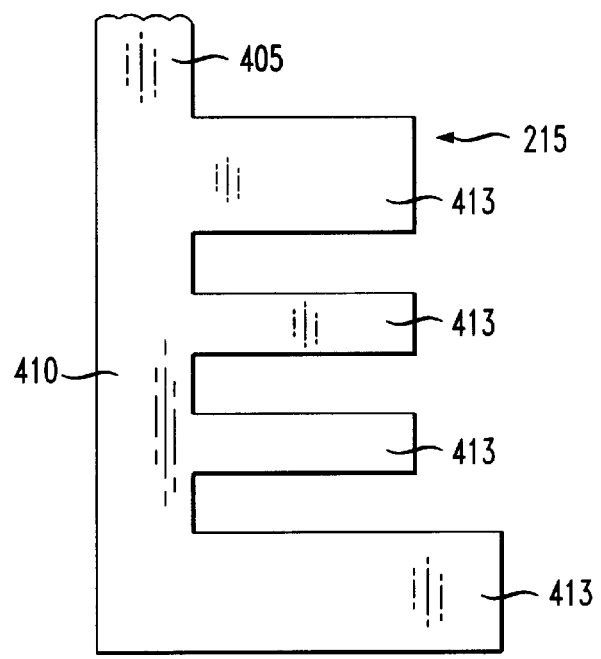
FIG. 4 illustrates a plan view of one embodiment of the second metal layer of FIG. 2.

The metal layer 215 may be formed beneath bond pad 219 in a variety of patterns to provide stress relief and to provide necessary interconnectivity of the elements of the microdevice. Referring now to FIG. 4, illustrated is a plan view of one embodiment of the second metal layer of FIG. 2. In the illustrated embodiment, the metal layer 215 has been patterned so that a plurality of fingers 413 attach to a spine 410. An extension 405 of spine 410 provides electrical connection to portions of the circuit which are not under bond pad 219.

Figure 5:
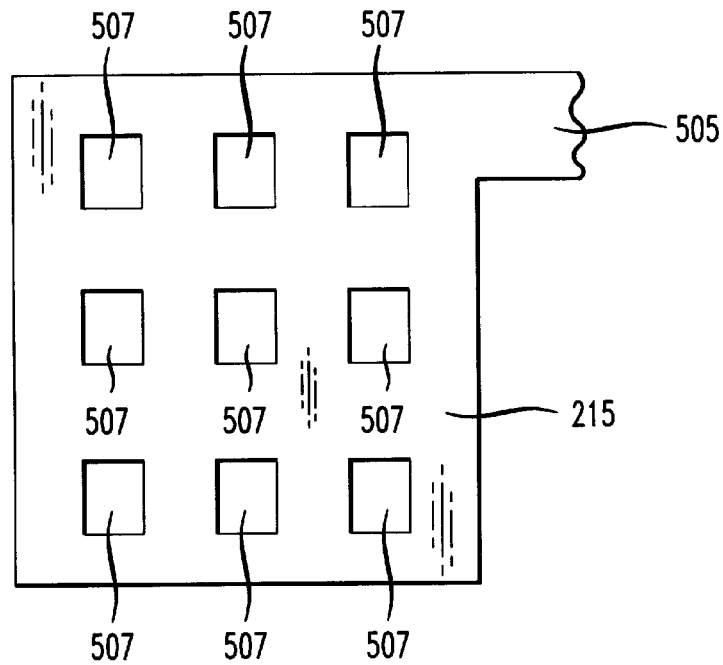
FIG. 5 illustrates a plan view of an alternative embodiment of the second metal layer of FIG. 2.

Referring now to FIG. 5, illustrated is a plan view of an alternative embodiment of the second metal layer of FIG. 2. In the embodiment of FIG. 5, metal layer 215 has openings 507 and provide stress relief within the device. Extension 505 provides electrical connection to portions of the circuit which are not under bond pads 219.

Figure 6:
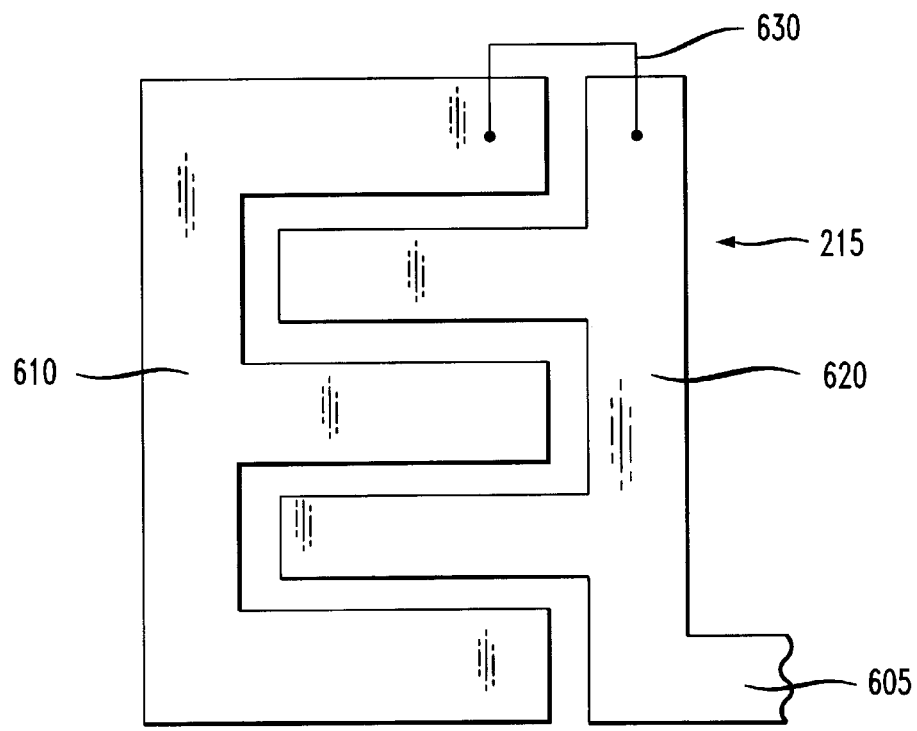
FIG. 6 illustrates a plan view of yet another alternative embodiment of the second metal layer of FIG. 2.

Referring now to FIG. 6, illustrated is a plan view of yet another alternative embodiment of the second metal layer of FIG. 2. In the embodiment of FIG. 6, a pair of interdigitated, comb-like structures 610, 620 comprise metal layer 215. Structures 610 and 620 are electrically connected by conductor 630. Extension 605 provides electrical connection to portions of the circuit which are not under bond pad 219.

Referring now back to FIGS. 1 and 2, those skilled in the art will recognize from the prior description that the footprint of metal layer 215 may be patterned so as to protect the BIST circuitry 120 during bonding of wires to the bond pads 103. Additionally, it should be apparent that a significant microcircuit density advantage is obtained over the prior art by placing the BIST circuitry 120 under and between the bond pads 103 versus within the primary microcircuitry 110 of the integrated circuit 100.

From the foregoing description, it is readily apparent that the present invention provides, in one embodiment, an integrated circuit having a substrate and active devices formed on the surface of the substrate. Other embodiments of the integrated circuit provide for having at least either three or four metal layers. In a particular embodiment of the present invention, the integrated circuit comprises a bond pad formed over a portion of the active devices. The bond pad has a footprint. As used therein the word footprint means the area covered by the device to which the word refers. The integrated circuit further includes a patterned metal layer having a metal layer footprint that is located between the bond pad and the substrate and a built-in self-test (BIST) circuit that has a BIST footprint, which is located between the substrate and the bond pad. In this particular embodiment, the bond pad footprint overlays at least a portion of the metal layer footprint and the BIST footprint. However, in a more advantageous embodiment, the bond pad footprint overlays a substantial portion of the metal layer footprint and the BIST footprint.

Although the present invention has been described in detail, those skilled in the art should understand that they can make various changes, substitutions and alterations herein without departing from the spirit and scope of the invention in its broadest form.

What is claimed is:

1. A method of manufacturing an integrated circuit having a substrate and active devices formed on the surface of said substrate, comprising the steps of:

forming a bond pad with a bond pad footprint over a portion of said active devices;

forming a patterned metal layer having a metal layer footprint between said bond pad and said substrate; and forming a built-in self-test (BIST) circuit having a BIST footprint between said substrate and said bond pad, said bond pad footprint overlaying at least a portion of said metal layer footprint and said BIST footprint.

2. The method as recited in claim 1 wherein the step of forming said patterned metal layer includes the step of electrically connecting said patterned metal layer to said bond pad.

3. The method as recited in claim 1 wherein said method further comprises the step of forming a plurality of metal levels within said integrated circuit.

4. The method as recited in claim 1 further comprising the step of forming a module and electrically connecting said BIST to said module.

5. The method as recited in claim 1 wherein said integrated circuit includes a plurality of circuits located on a plurality of die of a semiconductor wafer and said method further includes the step of forming a plurality of BIST circuits wherein each of said plurality of BIST circuits is connected to a different one of said plurality of die.

6. The method as recited in claim 1 wherein said step of forming a bond pad includes the step of substantially overlaying said BIST footprint with said bond pad footprint.

7. The method as recited in claim 1 wherein said step of forming a bond pad includes the step of substantially overlaying said metal layer footprint with said bond bad footprint.

8. The method as recited in claim 1 further comprising the step of forming a first dielectric layer separating said patterned metal layer from said bond pad, said patterned metal layer being electrically isolated from said active devices by a second dielectric layer.

9. The method as recited in claim 1 further comprising the step of forming electrical connections from said bond pad to said active device and from said patterned metal layer to said bond pad or said active devices.

10. The method as recited in claim 1 wherein said step of forming a patterned metal layer includes the step of forming a spine with a plurality of areas extending from said spine.

11. The method as recited in claim 1 wherein said step of forming a patterned metal layer includes the step of forming two electrically connected interdigitated combs.

* * * * *